(12) United States Patent
Ni et al.

(10) Patent No.: US 10,763,174 B2
(45) Date of Patent: Sep. 1, 2020

(54) METHOD FOR RECOVERING CARBON-FACE-POLARIZED SILICON CARBIDE SUBSTRATE

(71) Applicant: Suzhou Han Hua Semiconductor Co., Ltd, Suzhou (CN)

(72) Inventors: Xianfeng Ni, Suzhou (CN); Qian Fan, Suzhou (CN); Wei He, Suzhou (CN)

(73) Assignee: SUZHOU HAN HUA SEMICONDUCTOR CO., LTD., Suzhou, Jiangsu (CN)

( * ) Notice: Subject to any disclaimer, the term of this patent is extended or adjusted under 35 U.S.C. 154(b) by 0 days.

(21) Appl. No.: 16/562,452

(22) Filed: Sep. 6, 2019

(65) Prior Publication Data

US 2019/0393090 A1    Dec. 26, 2019

(30) Foreign Application Priority Data

Sep. 21, 2018  (CN) .......................... 2018 1 1104661

(51) Int. Cl.
*H01L 21/78* (2006.01)
*H01L 21/306* (2006.01)
*H01L 29/20* (2006.01)
*H01L 29/66* (2006.01)

(52) U.S. Cl.
CPC .... *H01L 21/7813* (2013.01); *H01L 21/30612* (2013.01); *H01L 29/2003* (2013.01); *H01L 29/66462* (2013.01)

(58) Field of Classification Search
CPC ......... H01L 21/30617; H01L 21/30612; H01L 21/7813; H01L 21/02079; H01L 29/2003; H01L 29/66462
USPC ........................................ 438/745, 751, 752
See application file for complete search history.

(56) References Cited

U.S. PATENT DOCUMENTS

| 2010/0327322 A1* | 12/2010 | Kub ...................... H01L 29/205 257/194 |
| 2013/0187532 A1* | 7/2013 | Sharifi .................... H01J 9/022 313/310 |
| 2013/0228797 A1* | 9/2013 | Nagasawa ......... H01L 21/02381 257/77 |
| 2014/0264379 A1* | 9/2014 | Kub .................. H01L 29/66477 257/77 |
| 2019/0382918 A1* | 12/2019 | Nagasawa ......... H01L 21/02529 |
| 2020/0006046 A1* | 1/2020 | Nagasawa ......... H01L 21/02008 |

* cited by examiner

*Primary Examiner* — Binh X Tran
(74) *Attorney, Agent, or Firm* — Westerman, Hattori, Daniels & Adrian, LLP

(57) ABSTRACT

A method for recovering carbon-face-polarized silicon carbide substrates, including: providing an epitaxial structure, the epitaxial structure includes a carbon-face-polarized silicon carbide substrate to be recovered, as well as a nitrogen-face-polarized gallium nitride buffer layer, a barrier layer and a nitrogen-face-polarized gallium nitride channel layer that are sequentially deposited on the silicon carbide substrate; removing the nitrogen-face-polarized gallium nitride buffer layer, the barrier layer and the nitrogen-face-polarized gallium nitride channel layer by wet etching; and cleaning and blowing dry the carbon-face-polarized silicon carbide substrate.

8 Claims, 1 Drawing Sheet

METHOD FOR RECOVERING CARBON-FACE-POLARIZED SILICON CARBIDE SUBSTRATE

CROSS REFERENCE TO THE RELATED APPLICATIONS

This application is based upon and claims priority to Chinese Patent Application No. 201811104661.3 filed on Sep. 21, 2018, the entire contents of which are incorporated herein by reference.

TECHNICAL FIELD

The present invention relates to the technical field of semiconductor, and in particular to a method for recovering carbon-face-polarized silicon carbide substrates.

BACKGROUND

In recent years, nitride-based HEMT (high electron mobility transistor) has been applied in fields such as mobile, satellite, and radar communication. Among mainstream substrates a sapphire, a silicon, a silicon carbide, etc.) used for nitride material deposition, the cost of a silicon carbide substrate is generally more than 10 times as much as that of other types of substrates due to higher manufacturing cost of silicon carbide and limited supply thereof on the market. Although the silicon carbide substrates have higher cost, currently major high-performance HEMT devices require the use of silicon carbide substrates, which cannot be replaced by other substrates due to the high performance requirement of the HEMT device. Therefore, recovery of the silicon carbide substrate after testing or after failure of deposition of the nitride material has significant economic benefit.

Recycling the silicon carbide substrate that can be reused for HEMT epitaxy is very technically challenging because the recovered silicon carbide substrate requires not only a smooth surface but also no trace chemical contamination of the substrate surface. Currently conventional silicon carbide recycling technologies involve mechanical thinning and polishing, chemical contamination can be easily introduced due to the use of various polishing agents and polishing fluids. In addition, since a conventional recycling method uses a grinding and polishing process, the thickness of the silicon carbide substrate is reduced, and the reduction of substrate thickness can cause subsequent changes of nitride epitaxial process (such as the temperature of substrate surface during epitaxy), thereby affecting the performance of final devices.

SUMMARY

The present application proposes a method for recovering carbon-face-polarized silicon carbide substrates, including:
providing an epitaxial structure, wherein the epitaxial structure comprises a carbon-face-polarized silicon carbide substrate to be recovered, as well as a nitrogen-face-polarized gallium nitride buffer layer, a barrier layer and a nitrogen-face-polarized gallium nitride channel layer that are sequentially deposited on the silicon carbide substrate;
removing the nitrogen-face-polarized gallium nitride buffer layer, the barrier layer and the nitrogen-face-polarized gallium nitride channel layer by wet etching; and
cleaning and blowing dry the carbon-face-polarized silicon carbide substrate.

In one embodiment, the wet etching uses a 10%-50% KOH solution.

In one embodiment, ethylene glycol is added to the KOH solution and the solution is heated to above 100° C.

In one embodiment, the wet etching solution is any one of the mixed solution of two or more ingredients of sodium hydroxide, phosphoric acid, and citric acid.

In one embodiment, the rate of the wet etching is greater than 100 nm/min.

In one embodiment, cleaning and blowing dry the surface of the silicon carbide substrate specifically comprising:
cleaning the surface of the silicon carbide substrate with deionized water;
blowing dry the silicon carbide substrate with a nitrogen gas.

In one embodiment, the epitaxial structure is irradiated with UV light during the wet etching.

In one embodiment, the UV light has a wavelength shorter than the wavelength corresponding to the gallium nitride bandgap.

The method for recovering the carbon-face-polarized silicon carbide substrate proposed by the present application can speed up the removal of the epitaxial structure, increase the substrate recycling efficiency, and eliminate the need for polishing and grinding processes, without any reduction of the thickness of the silicon carbide substrates after recycling, thereby reducing the difficulty of the subsequent process.

DETAILED DESCRIPTION OF THE EMBODIMENTS

A method for recovering carbon-face-polarized silicon carbide substrates proposed by the present invention will be further described in detail below with reference to the accompanying drawings and specific embodiments. Advantages and features of the present invention will be apparent from the description and appended claims. It should be noted that the drawings use a very simplified form and all use non-precise proportions, and are only to assist to describe the purpose of the embodiments of the present invention with convenience and clarity.

Figure 1:
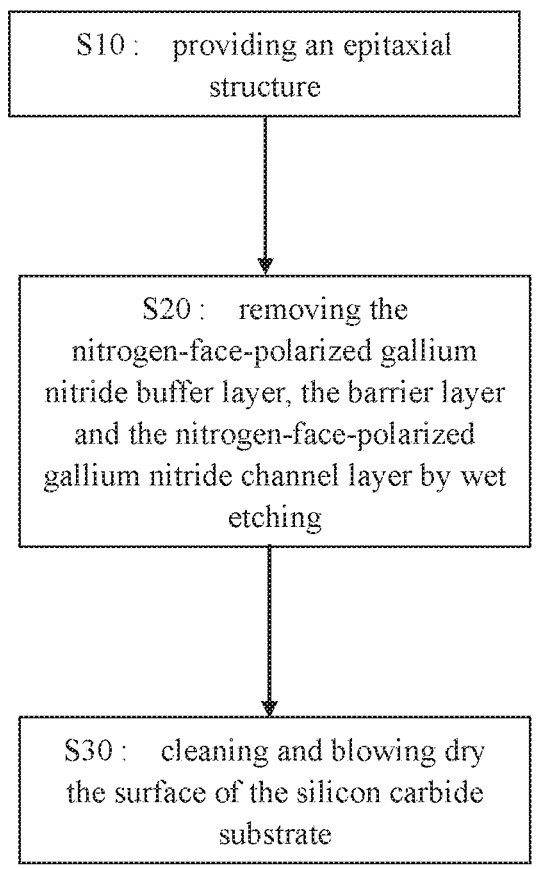
FIG. 1 is a flow chart of a method for recovering a silicon carbide substrate proposed by an embodiment of the present application.
Figure 2:
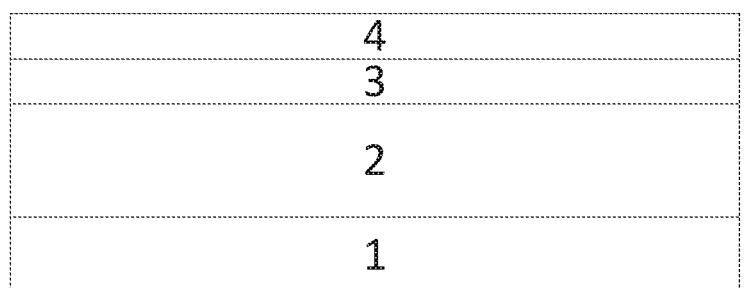
FIG. 2 is a view of an epitaxial structure to be recovered.
Figure 3:
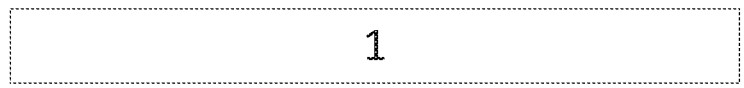
FIG. 3 is a view of a silicon carbide substrate.

Referring to FIG. 1 to FIG. 3, the method for recovering the silicon carbide substrate proposed in this embodiment includes:

S10: providing an epitaxial structure, wherein the epitaxial structure comprises a carbon-face-polarized silicon carbide substrate to be recovered, as well as a nitrogen-face-polarized gallium nitride buffer layer, a barrier layer and a nitrogen-face-polarized gallium nitride channel layer that are sequentially deposited on the silicon carbide substrate.

Specifically, referring to FIG. 2, the epitaxial structure includes the silicon carbide substrate 1, the gallium nitride buffer layer 2, the barrier layer 3, and the gallium nitride channel layer 4 which are sequentially deposited. The thickness of the gallium nitride buffer layer 2 is greater than 1 micron, the thickness of the barrier layer 3 is 10 nm to 100 nm, and the thickness of the gallium nitride channel layer 4 is 10 nm to 100 nm. The carbon-face-polarized silicon carbide substrate indicates that the surface of the silicon carbide substrate in contact with the gallium nitride buffer layer is carbon-face-polarized. The nitrogen-face-polarized gallium nitride buffer layer indicates that the surface of the gallium nitride buffer layer in contact with the barrier layer is nitrogen-face-polarized. The nitrogen-face-polarized channel layer indicates that the surface of the gallium nitride channel layer in contact with the barrier layer is gallium-face-polarized, and the other opposite surface is nitrogen-face-polarized, the surface of the gallium nitride channel layer in contact with the barrier layer has a two-dimensional electron gas to form a conductive path within the channel layer. The silicon carbide substrate and the gallium nitride buffer layer in the epitaxial structure are generally the silicon face polarity silicon carbide substrate and the gallium-face-polarized gallium nitride buffer layer, unless otherwise specified. Due to the different polarities of the gallium nitride, the method of removing the gallium nitride is also different. The present application specifically proposes a method for recovering the carbon-polarity-polarized silicon carbide substrate and removing the nitrogen-face-polarized gallium nitride.

S20: removing the nitrogen-face-polarized gallium nitride buffer layer, the barrier layer and the nitrogen-face-polarized gallium nitride channel layer by wet etching.

Specifically, the wet etching is performed by immersing the epitaxial structure including the nitrogen-face-polarized gallium nitride channel layer 4, the barrier layer 3, and the nitrogen-face-polarized gallium nitride buffer layer 2 into a solution, all of which are etched away, and only the carbon-face-polarized silicon carbide substrate 1 is retained to form a structure as shown in FIG. 3. The solution can be a mixed solution of 10% to 50% KOH (potassium hydroxide), or can be one of or a mixed solution of sodium hydroxide, phosphoric acid, citric acid. The rate of the wet etching is greater than 100/min. In order to accelerate the rate of the wet etching, ethylene glycol can be added to the KOH solution, and the mixed solution is heated to 100° C. or higher. And during the process of the wet etching, the solution is properly stirred to make the etching more uniform. Further, during the process of the wet etching, an epitaxial layer 2 can also be irradiated with UV light to increase an etching rate, so the UV light has a wavelength shorter than the wavelength corresponding to the gallium nitride material bandgap, such as Xe light, UV irradiation can form an electron hole pair in the epitaxial material, and a hole on the surface can promote the formation of an oxide, thereby promoting the etching of the epitaxial structure.

S30: cleaning and blowing dry the surface of the silicon carbide substrate.

Specifically, the chemical substance on the surface of the silicon carbide substrate 1 is cleaned with deionized water, and then the silicon carbide substrate 1 is blown dry with a nitrogen gas. The recovery of the silicon carbide substrate 1 is completed. Epitaxial growth can then be performed again on the recycled silicon carbide substrate 1.

The method for recovering the carbon-face-polarized silicon carbide substrate proposed by the present application can speed up the removal of the epitaxial structure, increase the recovery efficiency, and eliminate the need for polishing and grinding processes, and will not reduce the thickness of the silicon carbide substrate and therefore reduces the difficulty of the subsequent epitaxy process.

The technical features of the above-described embodiments can be arbitrarily combined, for the sake of brevity of description, all possible combinations of the technical features in the above embodiments are not described, however, as long as there is no contradiction between the combinations of these technical features, all should be considered as the scope of this description.

The above-described embodiments are merely illustrative of several embodiments of the present invention, and the description thereof is more specific and detailed, but is not to be construed as limiting the scope of the invention. It should be noted that a number of variations and modifications can be made by those skilled in the art without departing from the scope of protection of the present invention. Therefore, the scope of protection of the present invention should be determined by the appended claims.

What is claimed is:

1. A method of recovering carbon-face-polarized silicon carbide substrates, comprising:
    providing an epitaxial structure, wherein the epitaxial structure comprises a carbon-face-polarized silicon carbide substrate to be recovered, a nitrogen-face-polarized gallium nitride buffer layer, a barrier layer and a nitrogen-face-polarized gallium nitride channel layer sequentially laminated on the carbon-face-polarized silicon carbide substrate;
    removing the nitrogen-face-polarized gallium nitride buffer layer, the barrier layer and the nitrogen-face-polarized gallium nitride channel layer by wet etching; and
    cleaning and blowing dry the carbon-face-polarized silicon carbide substrate.

2. The method of recovering the carbon-face-polarized silicon carbide substrates according to claim 1, wherein, the wet etching solution comprises at least one selected from the group consisting of sodium hydroxide, phosphoric acid, and citric acid.

3. The method of recovering the carbon-face-polarized silicon carbide substrates according to claim 1, wherein, a rate of the wet etching is greater than 100 nm/min.

4. The method for recovering the carbon-face-polarized silicon carbide substrates according to claim 1, wherein, the step of cleaning and blowing dry the surface of the carbon-face-polarized silicon carbide substrate comprises:
    cleaning the surface of the carbon-face-polarized silicon carbide substrate with deionized water; and
    blowing dry the carbon-face-polarized silicon carbide substrate with nitrogen gas.

5. The method of recovering the carbon-face-polarized silicon carbide substrates according to claim 1, wherein, the wet etching uses a 10%-50% (by weight) KOH solution.

6. The method of recovering the carbon-face-polarized silicon carbide substrates according to claim 5, further comprising: adding ethylene glycol to the KOH solution and heating the KOH solution to above 100° C.

7. The method of recovering the carbon-face-polarized silicon carbide substrates according to claim 1, wherein, the epitaxial structure is irradiated with a UV light during the wet etching.

8. The method of recovering the carbon-face-polarized silicon carbide substrates according to claim 7, wherein, the UV light has a wavelength shorter than a wavelength corresponding to a gallium nitride bandgap of the nitrogen-face-polarized gallium nitride buffer layer.

* * * * *